(12) United States Patent
Cao et al.

(10) Patent No.: US 11,204,431 B2
(45) Date of Patent: Dec. 21, 2021

(54) X-RAY DETECTOR WITH A COOLING SYSTEM

(71) Applicant: SHENZHEN XPECTVISION TECHNOLOGY CO., LTD., Shenzhen (CN)

(72) Inventors: Peiyan Cao, Shenzhen (CN); Yurun Liu, Shenzhen (CN)

(73) Assignee: SHENZHEN XPECTVISION TECHNOLOGY CO., LTD., Shenzhen (CN)

( * ) Notice: Subject to any disclaimer, the term of this patent is extended or adjusted under 35 U.S.C. 154(b) by 0 days.

(21) Appl. No.: 16/852,854

(22) Filed: Apr. 20, 2020

(65) Prior Publication Data
US 2020/0249363 A1    Aug. 6, 2020

Related U.S. Application Data

(63) Continuation of application No. PCT/CN2017/107780, filed on Oct. 26, 2017.

(51) Int. Cl.
*G01T 1/24* (2006.01)

(52) U.S. Cl.
CPC ................... *G01T 1/244* (2013.01)

(58) Field of Classification Search
CPC ........ G01T 1/244; H01L 23/467; H01L 35/00
USPC .................................... 250/370.09
See application file for complete search history.

(56) References Cited

U.S. PATENT DOCUMENTS

| | | | | |
|---|---|---|---|---|
| 4,313,310 A | * | 2/1982 | Kobayashi | F24F 1/00 62/175 |
| 5,008,542 A | * | 4/1991 | Look | G01N 21/9501 250/341.4 |
| 5,270,544 A | * | 12/1993 | Taira | G01T 1/36 250/310 |

(Continued)

FOREIGN PATENT DOCUMENTS

| CN | 101521246 A | 9/2009 |
|---|---|---|
| CN | 104285164 A | 1/2015 |

(Continued)

OTHER PUBLICATIONS

PCT/CN2017/107780 ISA210 Mail Date Jun. 27, 2018.
(Continued)

*Primary Examiner* — David P Porta
*Assistant Examiner* — Gisselle M Gutierrez
(74) *Attorney, Agent, or Firm* — IPro, PLLC; Qian Gu

(57) ABSTRACT

Disclosed herein is a system suitable for X-ray detection. The system comprises a detector and cooling system configured to control temperature of the detector and prevent condensation of water vapor on the detector. The detector comprises an X-ray absorption layer and electronics layer. The X-ray absorption layer comprises a plurality of pixels, each pixel configured to count numbers of X-ray photons incident thereon whose energy falls in a plurality of bins, within a period of time. The electronics layer comprises an electronic system configured to add the numbers of X-ray photons for the bins of the same energy range counted by all the pixels. The cooling system comprises a chiller configured to lower temperature and moisture level of air, and a fan configured to blow the air that is cooled and dried to the detector.

28 Claims, 11 Drawing Sheets

(56) References Cited

U.S. PATENT DOCUMENTS

| | | |
|---|---|---|
| 2002/0150209 A1 | 10/2002 | Yokhin |
| 2009/0008564 A1 | 1/2009 | Balan et al. |
| 2014/0044240 A1* | 2/2014 | Pahlke ................ H01J 5/18 378/161 |
| 2014/0312238 A1* | 10/2014 | Liu .................... G01T 1/1618 250/363.03 |
| 2015/0139390 A1* | 5/2015 | Bellazzini ............ G01T 1/17 378/62 |
| 2018/0081071 A1* | 3/2018 | Cao .................... G01T 1/247 |
| 2018/0095039 A1* | 4/2018 | Cao .................... G01J 3/0208 |
| 2018/0180547 A1* | 6/2018 | Cao .................... G01N 21/6428 |
| 2019/0003971 A1* | 1/2019 | Cao .................... B01L 3/502715 |
| 2019/0011366 A1* | 1/2019 | Cao .................... G01N 21/648 |
| 2019/0047065 A1* | 2/2019 | Cao .................... G01T 1/244 |

FOREIGN PATENT DOCUMENTS

| | | |
|---|---|---|
| CN | 104345330 A | 2/2015 |
| WO | 2016197338 A1 | 12/2016 |

OTHER PUBLICATIONS

PCT/CN2017/107780 ISA237 Mail Date Jun. 27, 2018.
Christodoulou, Christiana. Application of a pixellated detector to energy dispersive x-ray diffraction, and investigation of materials for breast tissue diffraction evaluation Diss. UCL (University College London), 2016.

* cited by examiner

X-RAY DETECTOR WITH A COOLING SYSTEM

TECHNICAL FIELD

The disclosure herein relates to an X-ray detector, especially an X-ray detector having a cooling system.

BACKGROUND

X-ray detectors may be devices used to measure the flux, spatial distribution, spectrum or other properties of X-rays.

X-ray detectors may be used for many applications. One important application is imaging. X-ray imaging is a radiography technique and can be used to reveal the internal structure of a non-uniformly composed and opaque object such as the human body.

Early X-ray detectors for imaging include photographic plates and photographic films. A photographic plate may be a glass plate with a coating of light-sensitive emulsion. Although photographic plates were replaced by photographic films, they may still be used in special situations due to the superior quality they offer and their extreme stability. A photographic film may be a plastic film (e.g., a strip or sheet) with a coating of light-sensitive emulsion.

In the 1980s, photostimulable phosphor plates (PSP plates) became available. A PSP plate may contain a phosphor material with color centers in its lattice. When the PSP plate is exposed to X-ray, electrons excited by X-ray are trapped in the color centers until they are stimulated by a laser beam scanning over the plate surface. As the plate is scanned by laser, trapped excited electrons give off light, which is collected by a photomultiplier tube. The collected light is converted into a digital image. In contrast to photographic plates and photographic films, PSP plates can be reused.

Another kind of X-ray detectors are X-ray image intensifiers. Components of an X-ray image intensifier are usually sealed in a vacuum. In contrast to photographic plates, photographic films, and PSP plates, X-ray image intensifiers may produce real-time images, i.e., do not require post-exposure processing to produce images. X-ray first hits an input phosphor (e.g., cesium iodide) and is converted to visible light. The visible light then hits a photocathode (e.g., a thin metal layer containing cesium and antimony compounds) and causes emission of electrons. The number of emitted electrons is proportional to the intensity of the incident X-ray. The emitted electrons are projected, through electron optics, onto an output phosphor and cause the output phosphor to produce a visible-light image.

Scintillators operate somewhat similarly to X-ray image intensifiers in that scintillators (e.g., sodium iodide) absorb X-ray and emit visible light, which can then be detected by a suitable image sensor for visible light. In scintillators, the visible light spreads and scatters in all directions and thus reduces spatial resolution. Reducing the scintillator thickness helps to improve the spatial resolution but also reduces absorption of X-ray. A scintillator thus has to strike a compromise between absorption efficiency and resolution.

Semiconductor X-ray detectors largely overcome this problem by direct conversion of X-ray into electric signals. A semiconductor X-ray detector may include a semiconductor layer that absorbs X-ray in wavelengths of interest. When an X-ray photon is absorbed in the semiconductor layer, multiple charge carriers (e.g., electrons and holes) are generated and swept under an electric field towards electrical contacts on the semiconductor layer. Cumbersome heat management required in currently available semiconductor X-ray detectors (e.g., Medipix) can make a detector with a large area and a large number of pixels difficult or impossible to produce.

SUMMARY

Disclosed herein is a system, comprising: a detector comprising an X-ray absorption layer, an electronics layer; and a cooling system configured to control temperature of the detector and prevent condensation of water vapor on the detector; wherein the X-ray absorption layer comprises a plurality of pixels, each pixel configured to count numbers of X-ray photons incident thereon whose energy falls in a plurality of bins, within a period of time; wherein the electronics layer comprises an electronic system configured to add the numbers of X-ray photons for the bins of the same energy range counted by all the pixels; wherein the cooling system comprises a chiller configured to lower temperature and moisture level of air, and a fan configured to blow the air that is cooled and dried to the detector.

According to an embodiment, the chiller comprises a Peltier cooler.

According to an embodiment, the chiller comprises a compressor, a condenser, an evaporator and an expansion valve.

According to an embodiment, the cooling system further comprises a desiccant dehumidifier configured to extract moisture from the air before blowing the air to the detector.

According to an embodiment, the system further comprises a transmission window covering an X-ray receiving surface of the X-ray absorption layer, wherein the transmission window is configured to allow X-ray photons to pass through and reach the X-ray absorption layer.

According to an embodiment, the transmission window comprises polyimide, graphene, polycarbonate, poly(p-xylene), silicon nitride, aluminum, beryllium, or a combination thereof.

The system of claim 1, wherein the detector is not vacuum-encapsulated in a gas tight housing.

According to an embodiment, the system further comprises a cold plate configured to cool the detector by absorbing heat from the detector, wherein the detector is mounted on the cold plate.

According to an embodiment, the cold plate is a heat sink, wherein the heat sink is configured to transfer heat absorbed from the detector to the air from the cooling system flowing through and around the heat sink.

According to an embodiment, the cold plate is a cooling plate of a Peltier cooler.

According to an embodiment, the cold plate is a metal plate cooled by a Peltier cooler or an air conditioner.

According to an embodiment, the detector is configured to compile the added numbers as a spectrum of the X-ray photons incident on the detector.

According to an embodiment, the plurality of pixels are arranged in an array.

According to an embodiment, the pixels are configured to count the numbers of X-ray photons within a same period of time.

According to an embodiment, each of the pixels comprises an analog-to-digital converter (ADC) configured to digitize an analog signal representing the energy of an incident X-ray photon into a digital signal.

According to an embodiment, the pixels are configured to operate in parallel.

According to an embodiment, each of the pixels is configured to measure its dark current.

According to an embodiment, each of the pixels is configured to measure its dark current before or concurrently with each X-ray photon incident thereon.

According to an embodiment, each of the pixels is configured to deduct a contribution of the dark current from the energy of an X-ray photon incident thereon.

According to an embodiment, each of the pixels is configured to measure its dark current by measuring a time it takes for a voltage to increase by a threshold.

According to an embodiment, the ADC is a successive-approximation-register (SAR) ADC.

According to an embodiment, the electronic system comprises a first voltage comparator configured to compare a voltage of an electric contact of the X-ray absorption layer to a first threshold, a second voltage comparator configured to compare the voltage to a second threshold, a controller, a plurality of counters each associated with a bin and configured to register a number of X-ray photons absorbed by one of the pixels wherein the energy of the X-ray photons falls in the bin; wherein the controller is configured to start a time delay from a time at which the first voltage comparator determines that an absolute value of the voltage equals or exceeds an absolute value of the first threshold; wherein the controller is configured to determine whether an energy of an X-ray photon falls into the bin; wherein the controller is configured to cause the number registered by the counter associated with the bin to increase by one.

According to an embodiment, the electronic system further comprises a capacitor module electrically connected to the electric contact, wherein the capacitor module is configured to collect charge carriers from the electric contact.

According to an embodiment, the controller is configured to activate the second voltage comparator at a beginning or expiration of the time delay.

According to an embodiment, the controller is configured to connect the electric contact to an electrical ground.

According to an embodiment, a rate of change of the voltage is substantially zero at expiration of the time delay.

According to an embodiment, the X-ray absorption layer comprises a diode.

According to an embodiment, the X-ray absorption layer comprises silicon, germanium, GaAs, CdTe, CdZnTe, or a combination thereof.

According to an embodiment, the detector does not comprise a scintillator.

DETAILED DESCRIPTION

A semiconductor X-ray detector may benefit from being operated at an operating temperature within a specific temperature range. The choice of the specific temperature range depends on the application details of the detector and the semiconductor material used for X-ray absorption in the detector. For example, the temperature range for semiconductor X-ray detectors using silicon (Si) or germanium (Ge) for absorption may be from −40° C. to −90° C., which may help reduce electrical noise due to thermal excitations of valence electrons, which may have enough energy to cross the band gap of Si or Ge and reach the conduction band. The temperature range for detectors using CdTe or CdZnTe for absorption may be higher (e.g., around room temperature) than the temperature range for detectors using Si or Ge, because CdTe and CdZnTe have larger band gaps than Si and Ge and thus lower probability of thermally excited electrons with sufficient energy to cross the band gap of CdTe or CdZnTe. When a detector operates at temperatures below room temperature (e.g., 0° C., −20° C., −40° C., etc.), microscopic contaminants such as hydrocarbon and water vapor may deposit onto the detector and affect its operation.

Figure 1A:
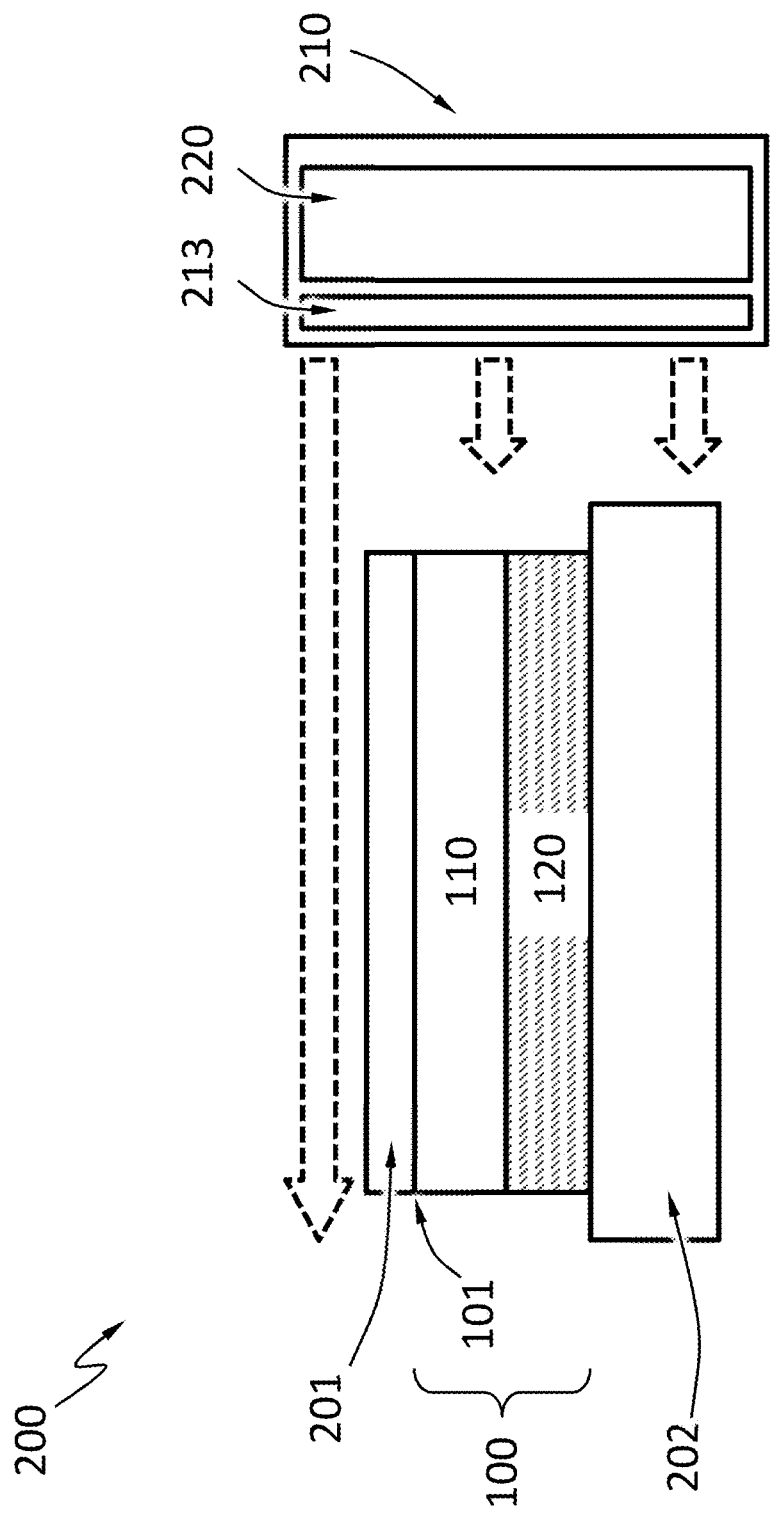
FIG. 1A and FIG. 1B schematically show a cross-sectional view and a perspective view of a system suitable for X-ray detection respectively, according to an embodiment.
Figure 1B:
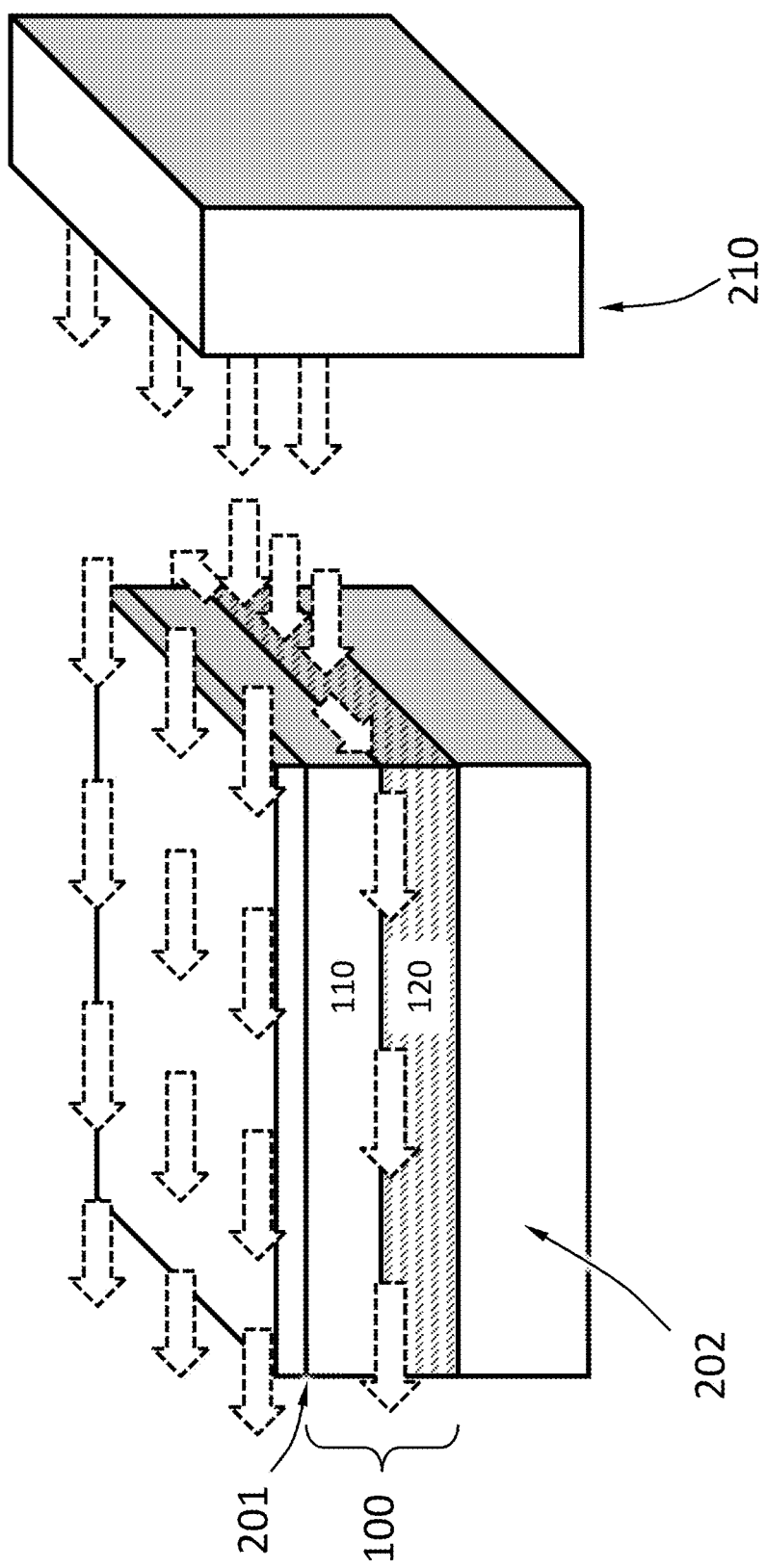

FIG. 1A and FIG. 1B schematically show a cross-sectional view and a perspective view of a system 200 suitable for X-ray detection respectively, according to an embodiment. The system 200 comprises a detector 100 configured to detect X-ray photons incident thereon and a cooling system 210 configured to control temperature of the detector 100 and reduce condensation of water vapor on the detector 100. In an embodiment, the detector 100 is not vacuum-encapsulated in a gas tight housing. The system 200 may further comprise a transmission window 201 covering an X-ray receiving surface 101 of the detector 100. The system 200 may further comprise a cold plate 202 on which the detector 100 is mounted, and the cold plate 202 (e.g., a fin heat sink in FIG. 3, a Peltier cooler, etc.) may be configured to cool the detector 100 by absorbing heat from the detector 100. Thermally conductive adhesives such as Epoxy may be applied between the detector 100 and the cold plate 202 to improve thermal conductivity and mechanical strength of the bonding.

The detector 100 may include an X-ray absorption layer 110 and an electronics layer 120 (e.g., an ASIC) for processing or analyzing electrical signals incident X-ray generates in the X-ray absorption layer 110. In an embodiment, the detector 100 does not comprise a scintillator. The X-ray absorption layer 110 may include a semiconductor material such as, Si, Ge, GaAs, CdTe, CdZnTe, or a combination thereof. The semiconductor may have a high mass attenuation coefficient for the X-ray energy of interest.

The cooling system 210 may comprise a chiller 220 and a fan 213. The chiller 220 may comprise an air-cooling system in FIG. 2A, a Peltier cooler in FIG. 2B, or any other suitable cooling device. The chiller 220 may be configured to lower temperature and moisture level of air passing the chiller 220, and the fan 213 may be configured to blow the air cooled and dried by the chiller 220 to the detector 100 so that the detector 100 is kept dry and cool (e.g., at 0° C., −20° C., −40° C., etc.). The word "air" as used herein is not limited to the mixture of gases in the Earth atmosphere, but can be any gas (e.g., nitrogen and argon). In the example of FIG. 1A and FIG. 1B, the air flow (shown by dashed arrows) from the cooling system 210 is directed towards a surface facing incident X-ray or sidewalls of the detector 100 to take away heat and moisture from the surface and sidewalls.

The transmission window 201 may comprise a material such as polyimide, graphene carbon, polycarbonate, poly (p-xylylene), silicon nitride, aluminum, beryllium, or a combination thereof. The material for the transmission window 201 may have small attenuation of X-rays to be detected so that most of the X-rays (e.g., 80%, 90%, 95%, 99%, etc.) incident thereon can pass through the transmission window 201 and reach the X-ray absorption layer 110. The transmission window 201 may also be configured to block unwanted radiation such as UV light and visible light. The transmission window 201 may be formed onto the X-ray receiving surface 101 by methods such as spin coating, physical vapor deposition, chemical vapor deposition, or any other suitable methods.

Figure 2A:
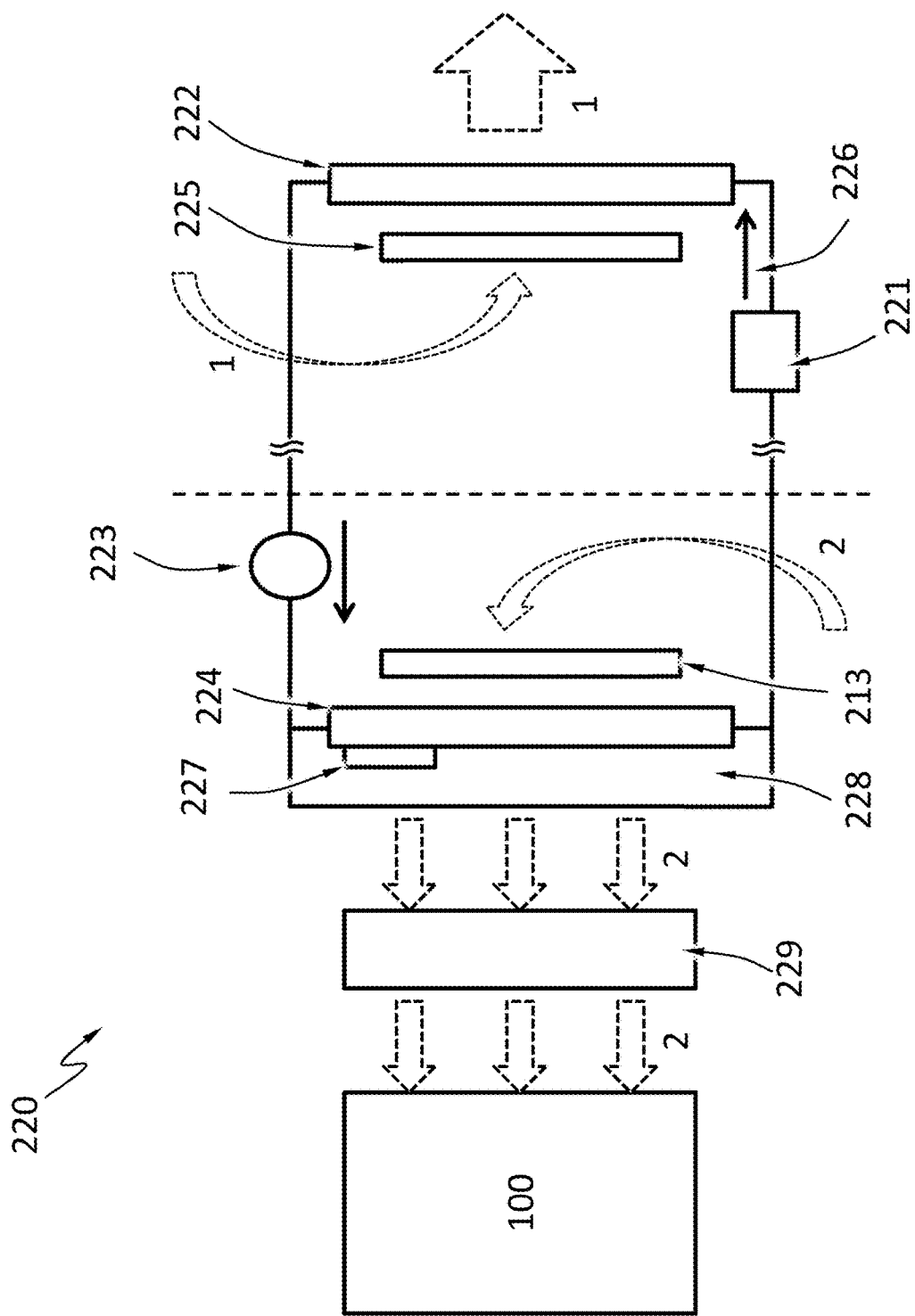
FIG. 2A schematically shows a block diagram of a chiller, according to an embodiment.

FIG. 2A schematically shows a block diagram of a chiller 220, according to an embodiment. The chiller 220 may comprise a compressor 221, a condenser 222, an expansion valve 223 and an evaporator 224 (or cooling coil), another fan 225, and a thermostat 227. During a working cycle of the chiller 220, the compressor 221 compresses a coolant 226 (shown by solid arrows) from a gas form to a liquid form by increasing pressure. Heat is generated during the compression. To dissipate the heat, the coolant 226 in the liquid form is pump to the condenser 222 where air 1 drawn in by the fan 225 takes away the heat and cools down the coolant 226 in the liquid form. The coolant 226 in the liquid form is then directed towards the expansion valve 223, which controllably releases the coolant 226 in the liquid form to the evaporator 224. The coolant 226 in the liquid form transforms back to gas form and absorbs heat from the surrounding upon going through the expansion valve 223 and the evaporator 224. When air 2 drawn in by the fan 213 passes through the evaporator 224 or a heat sink attached thereto (e.g. a fin heat sink in FIG. 3), the air 2 is cooled and also dehumidified due to condensation of moisture on the evaporator 224. The water that condenses on the evaporator 224 is later drained away in liquid form. In the end, the coolant 226 in the gas form returns to the compressor 221, and another working cycle may continue. The thermostat 227 is configured to control the temperature of the air 2 blowing to the detector 100 by regulating the temperature of the evaporator 224 (e.g., by regulating the flow of the coolant 226).

Figure 2B:
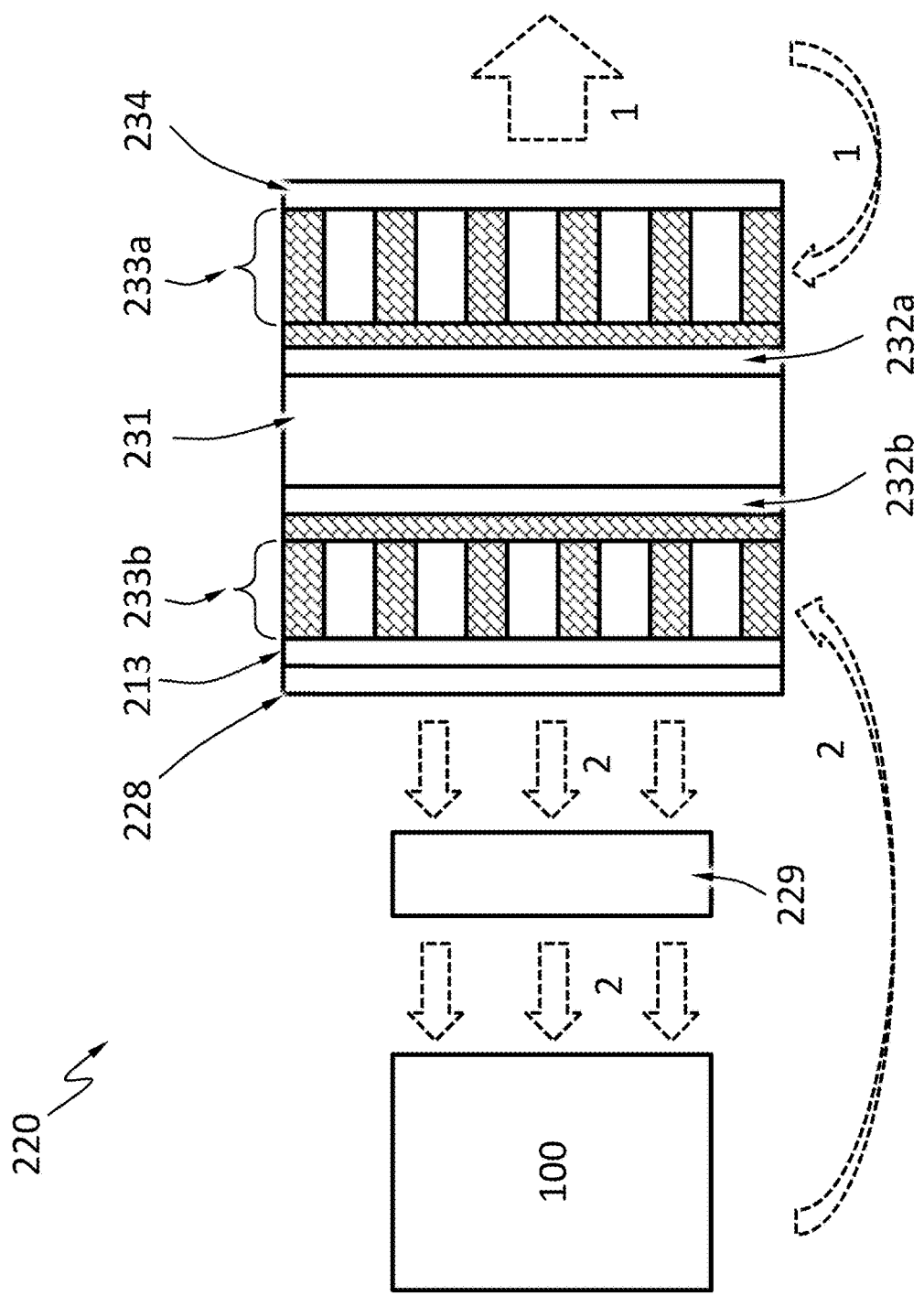
FIG. 2B schematically shows a block diagram of a chiller comprising a Peltier cooler, according to an embodiment.

FIG. 2B schematically shows a block diagram of a chiller 220 comprising a Peltier cooler 231, according to an embodiment. The Peltier cooler 231 is a semiconductor based electronic component capable of converting a voltage or current input into a temperature difference on its two surfaces (i.e., a heating plate 232a and a cooling plate 232b). For example, when a current is applied to the Peltier cooler 231, the cooling plate 232b is cooled down, and the heating plate 232a is heated up. By regulating the magnitude of the electric current flowing through the Peltier cooler 231, temperature of the heating plate 232a and the cooling plate 232b can be controlled. The Peltier cooler 231 may further comprise a heat sink 233a (e.g., a fin heat sink in FIG. 3) attached to the heating plate 232a, and another heat sink 233b (e.g., a fin heat sink in FIG. 3) attached to the cooling plate 232b. A heat sink is a heat exchanger configured to transfer heat between a solid substance (e.g., the heating plate 232a or the cooling plate 232b) and a fluid (liquid or gas). The heat sink may have a large contact area with the fluid. In the example of FIG. 2B, the fan 234 draws air 1 into the heat sink 233a, and the heat sink 233a transfers heat from the heating plate 232a to the air 1 flowing through. The fan 213 draws air 2 into the heat sink 233b, and the heat sink 233b cools the air 2 by transferring heat from the air 2 to the cooling plate 232b and also dehumidifies the air 2 by condensation of moisture in the air 2 on the heat sink 233b. The moisture that condenses on the heat sink 233b may be drained away in a liquid form.

In an embodiment, the cooling system 210 may further comprise an air flow control panel 228 (shown in FIGS. 2A and 2B) configured to adjust the air flow pattern of the air 2 blown to the detector 100 to achieve effective cooling and dehumidifying. For example, a portion of the air 2 may be directed towards the surface and sidewalls of the detector 100 as shown in FIGS. 1A and 1B, while another portion of the air 2 may be directed to the cold plate 202 that is a fin heat sink (shown in FIG. 3) underneath the detector 100.

In an embodiment, the cooling system 210 may further comprise an additional dehumidifier 229 (shown in FIGS. 2A and 2B) such as a desiccant dehumidifier configured to further extract moisture from the air cooled and dried by the chiller 220 before blowing to the detector 100. For example, a desiccant dehumidifier uses a moisture-absorbing material to absorb moisture from the air at low temperatures (e.g., below 0° C.). The additional dehumidifier 229 may be placed in between the chiller 220 and the detector 100.

Figure 3:
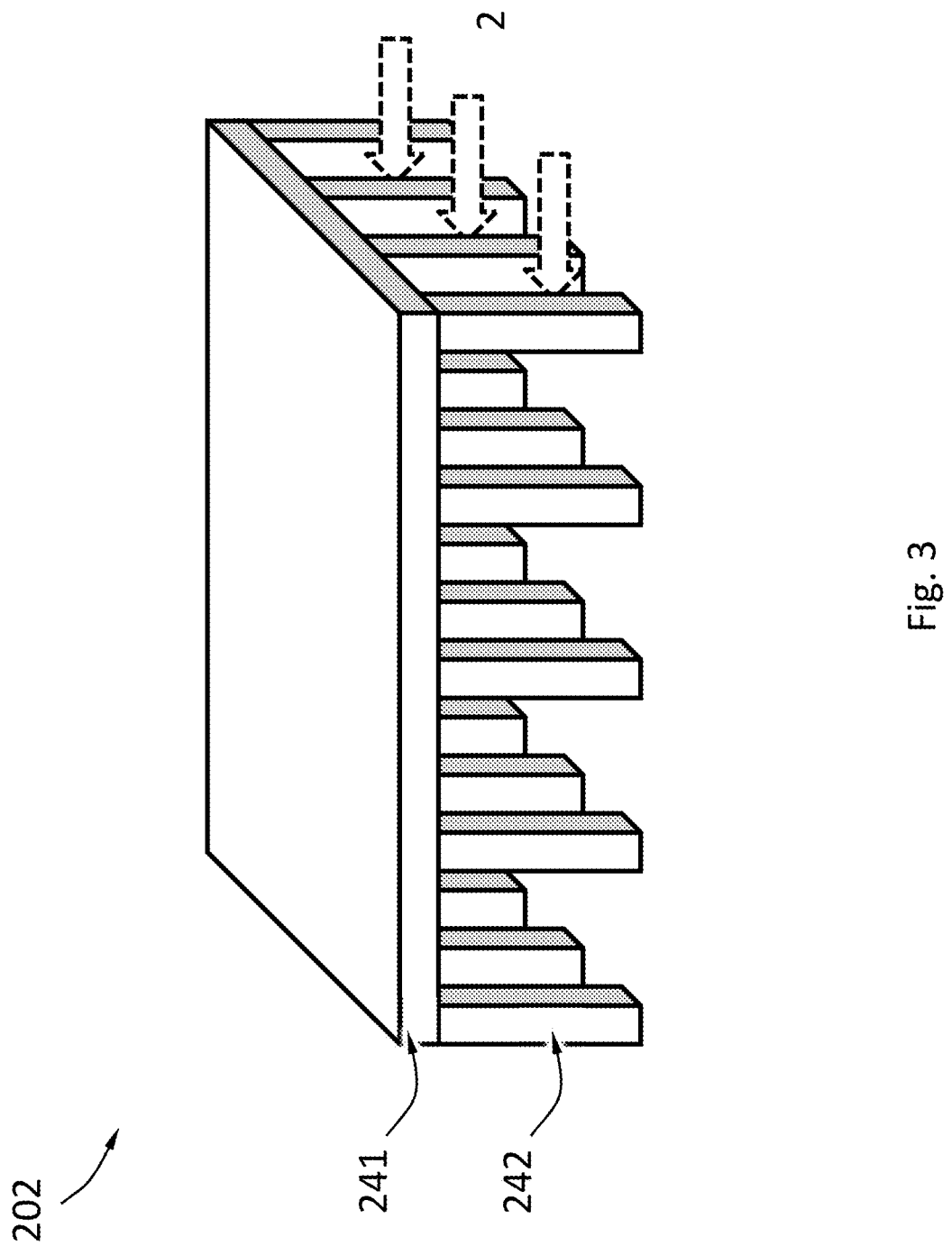
FIG. 3 schematically illustrates a cold plate that is a fin heat sink, according to an embodiment.

FIG. 3 schematically illustrates the cold plate 202 that is a fin heat sink, according to an embodiment. The fin heat sink may comprise a base 241 and a plurality of fins 242, both of which may comprise materials with good thermal conductivity such as copper and aluminum. The detector 100 may be mounted on and transfer heat to the base 241. The fins 242 are incorporated to increase surface area to enhance heat dissipation efficiency of the detector 100. When the air (e.g., air 2 in FIG. 2A and FIG. 2B) from the cooling system 210 flowing through and around the heat sink, heat absorbed from the detector 100 by the heat sink can be transferred to the air so that the detector 100 may be cooled down.

In an embodiment, the cold plate 202 may be a cooling plate of a Peltier cooler. The cooling plate may have a temperate close to an operating temperature of the detector (e.g., 0° C., −20° C., −40° C., etc.). In another embodiment, the cold plate 202 may be a metal plate comprising a material with good thermal conductivity such as copper, aluminum, or a combination thereof. The metal plate may be cooled by one or more Peltier coolers whose cooling plate is attached to the metal plate. The metal plate can also be cooled by an air conditioner. For example, the air conditioner may have cooling pipes containing coolant attached to the metal plate and circulate the coolant to absorb heat from the metal plate.

Figure 4:
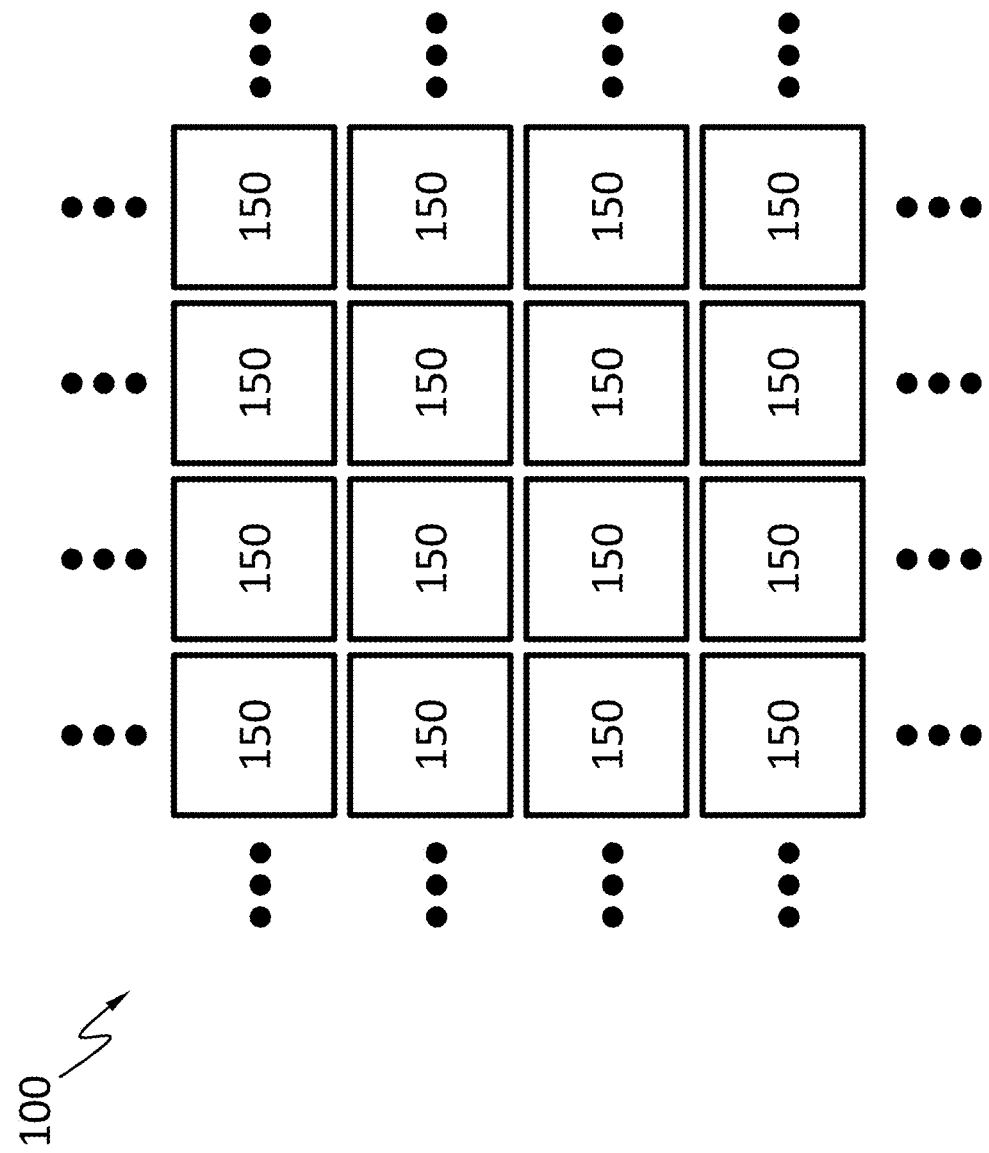
FIG. 4 schematically shows the detector in FIG. 1A, according to an embodiment.

FIG. 4 schematically shows the detector 100 in FIG. 1A, according to an embodiment. The detector has an array of pixels 150. The array may be a rectangular array, a honeycomb array, a hexagonal array or any other suitable array. Each pixel 150 is configured to detect an X-ray photon incident thereon and measure the energy of the X-ray photon. For example, each pixel 150 is configured to count numbers of X-ray photons incident thereon whose energy falls in a plurality of bins, within a period of time. All the pixels 150 may be configured to count the numbers of X-ray photons incident thereon within a plurality of bins of energy within the same period of time. Each pixel 150 may have its own analog-to-digital converter (ADC) configured to digitize an analog signal representing the energy of an incident X-ray photon into a digital signal. For XRF applications, an ADC with a 10-bit resolution or higher is useful. Each pixel 150 may be configured to measure its dark current, such as before or concurrently with each X-ray photon incident thereon. Each pixel 150 may be configured to deduct the contribution of the dark current from the energy of the X-ray photon incident thereon. The pixels 150 may be configured to operate in parallel. For example, when one pixel 150 measures an incident X-ray photon, another pixel 150 may be waiting for an X-ray photon to arrive. The pixels 150 may not have to be individually addressable.

The detector 100 may have at least 100, 2500, 10000, or more pixels 150. The detector 100 may be configured to add the numbers of X-ray photons for the bins of the same energy range counted by all the pixels 150. For example, the detector 100 may add the numbers the pixels 150 stored in a bin for energy from 70 KeV to 71 KeV, add the numbers the pixels 150 stored in a bin for energy from 71 KeV to 72 KeV, and so on. The detector 100 may compile the added numbers for the bins as a spectrum of the X-ray photons incident on the detector 100

Figure 5A:
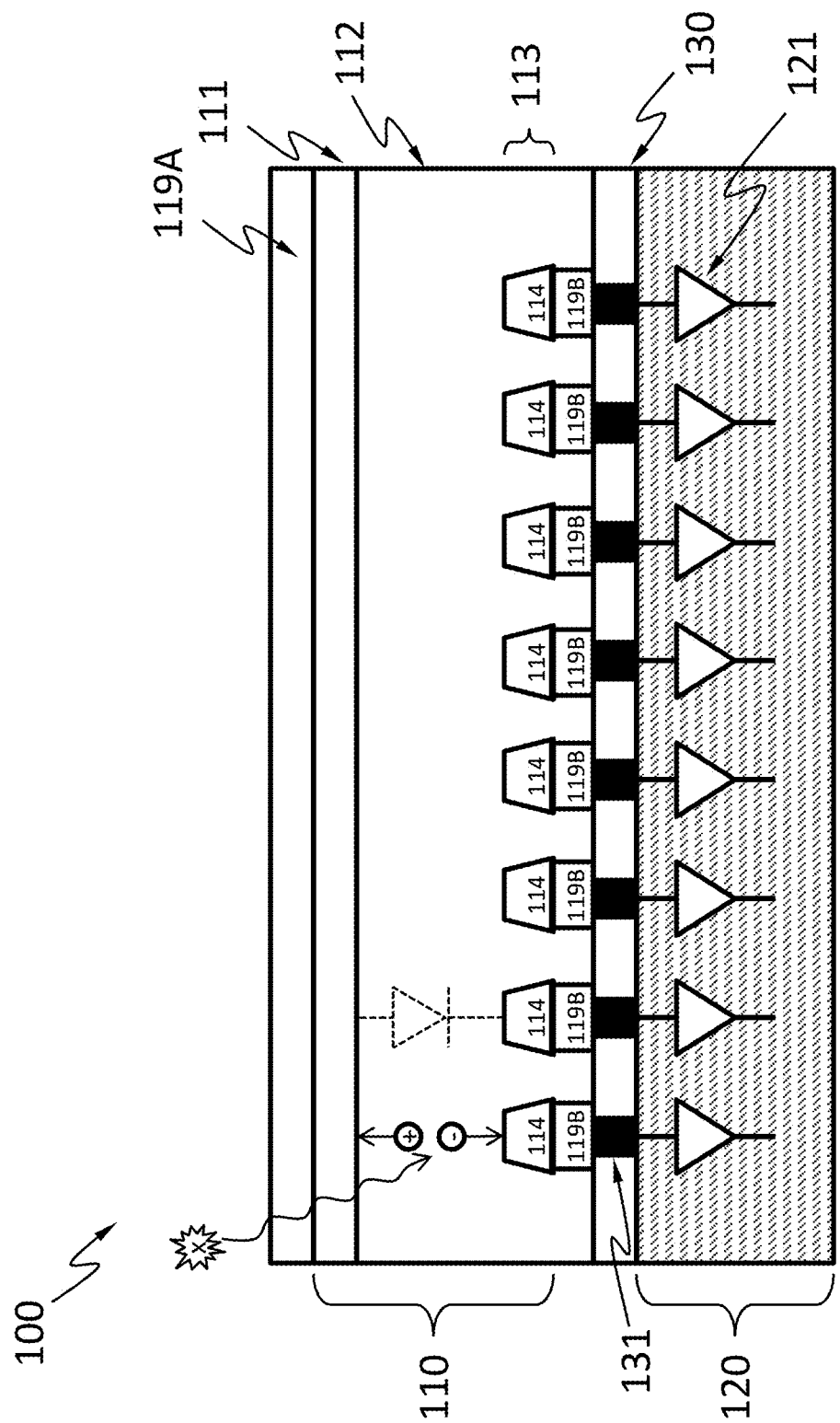
FIG. 5A schematically shows a detailed cross-sectional view of the detector in FIG. 1A, according to an embodiment.

FIG. 5A schematically shows a detailed cross-sectional view of the detector 100 in FIG. 1A, according to an embodiment, the X-ray absorption layer 110 may include one or more diodes (e.g., p-i-n or p-n) formed by a first doped region 111, one or more discrete regions 114 of a second doped region 113. The second doped region 113 may be separated from the first doped region 111 by an optional the intrinsic region 112. The discrete regions 114 are separated from one another by the first doped region 111 or the intrinsic region 112. The first doped region 111 and the second doped region 113 have opposite types of doping (e.g., region 111 is p-type and region 113 is n-type, or region 111 is n-type and region 113 is p-type). In the example in FIG. 5A, each of the discrete regions 114 of the second doped region 113 forms a diode with the first doped region 111 and the optional intrinsic region 112. Namely, in the example in FIG. 5A, the X-ray absorption layer 110 has a plurality of diodes having the first doped region 111 as a shared electrode. The first doped region 111 may also have discrete portions.

When an X-ray photon hits the X-ray absorption layer 110 including diodes, the X-ray photon may be absorbed and generate one or more charge carriers by a number of mechanisms. An X-ray photon may generate 10 to 100000 charge carriers. The charge carriers may drift to the electrodes of one of the diodes under an electric field. The field may be an external electric field. The electrical contact 119B may include discrete portions each of which is in electrical contact with the discrete regions 114. In an embodiment, the charge carriers may drift in directions such that the charge carriers generated by a single X-ray photon are not substantially shared by two different discrete regions 114 ("not substantially shared" here means less than 2%, less than 0.5%, less than 0.1%, or less than 0.01% of these charge carriers flow to a different one of the discrete regions 114 than the rest of the charge carriers). Charge carriers generated by an X-ray photon incident around the footprint of one of these discrete regions 114 are not substantially shared with another of these discrete regions 114. A pixel 150 associated with a discrete region 114 may be an area around the discrete region 114 in which substantially all (more than 98%, more than 99.5%, more than 99.9%, or more than 99.99% of) charge carriers generated by an X-ray photon incident therein flow to the discrete region 114. Namely, less than 2%, less than 1%, less than 0.1%, or less than 0.01% of these charge carriers flow beyond the pixel.

Figure 5B:
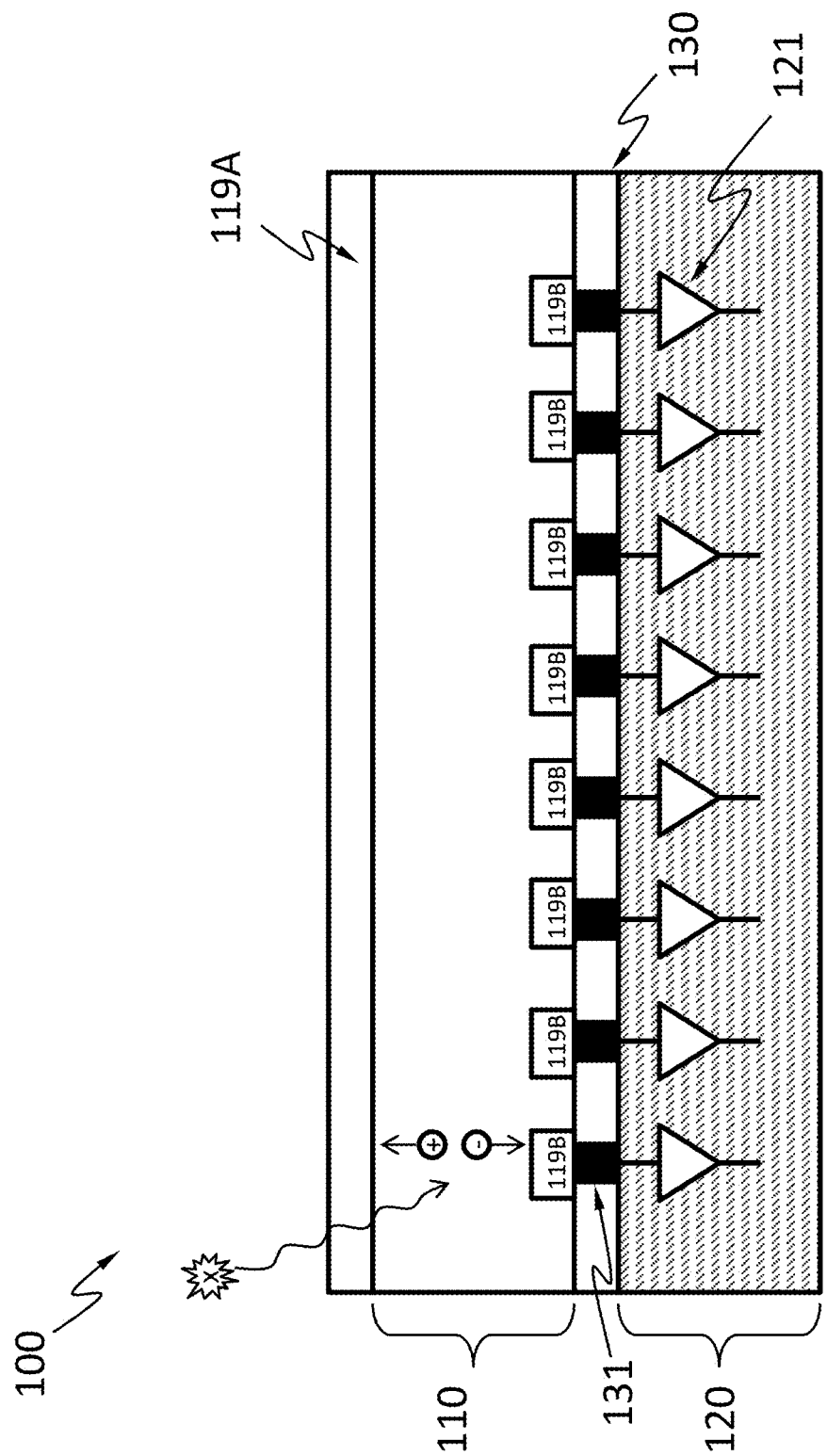
FIG. 5B schematically shows an alternative detailed cross-sectional view of the detector in FIG. 1A, according to an embodiment.

As shown in an alternative detailed cross-sectional view of the detector 100 in FIG. 5B, according to an embodiment, the X-ray absorption layer 110 may include a resistor of a semiconductor material such as, silicon, germanium, GaAs, CdTe, CdZnTe, or a combination thereof, but does not include a diode. The semiconductor may have a high mass attenuation coefficient for the X-ray energy of interest.

When an X-ray photon hits the X-ray absorption layer 110 including a resistor but not diodes, it may be absorbed and generate one or more charge carriers by a number of mechanisms. An X-ray photon may generate 10 to 100000 charge carriers. The charge carriers may drift to the electrical contacts 119A and 119B under an electric field. The field may be an external electric field. The electrical contact 119B includes discrete portions. In an embodiment, the charge carriers may drift in directions such that the charge carriers generated by a single X-ray photon are not substantially shared by two different discrete portions of the electrical contact 119B ("not substantially shared" here means less than 2%, less than 0.5%, less than 0.1%, or less than 0.01% of these charge carriers flow to a different one of the discrete portions than the rest of the charge carriers). Charge carriers generated by an X-ray photon incident around the footprint of one of these discrete portions of the electrical contact 119B are not substantially shared with another of these discrete portions of the electrical contact 119B. A pixel 150 associated with a discrete portion of the electrical contact 119B may be an area around the discrete portion in which substantially all (more than 98%, more than 99.5%, more than 99.9% or more than 99.99% of) charge carriers generated by an X-ray photon incident therein flow to the discrete portion of the electrical contact 119B. Namely, less than 2%, less than 0.5%, less than 0.1%, or less than 0.01% of these charge carriers flow beyond the pixel associated with the one discrete portion of the electrical contact 119B.

The electronics layer 120 may include an electronic system 121 suitable for processing or interpreting signals generated by X-ray photons incident on the X-ray absorption layer 110. The electronic system 121 may include an analog circuitry such as a filter network, amplifiers, integrators, and comparators, or a digital circuitry such as a microprocessors, and memory. The electronic system 121 may include components shared by the pixels or components dedicated to a single pixel. For example, the electronic system 121 may include an amplifier dedicated to each pixel and a microprocessor shared among all the pixels. The electronic system 121 may be electrically connected to the pixels by vias 131. Space among the vias may be filled with a filler material 130, which may increase the mechanical stability of the connection of the electronics layer 120 to the X-ray absorption layer 110. Other bonding techniques are possible to connect the electronic system 121 to the pixels without using vias.

Figure 6A:
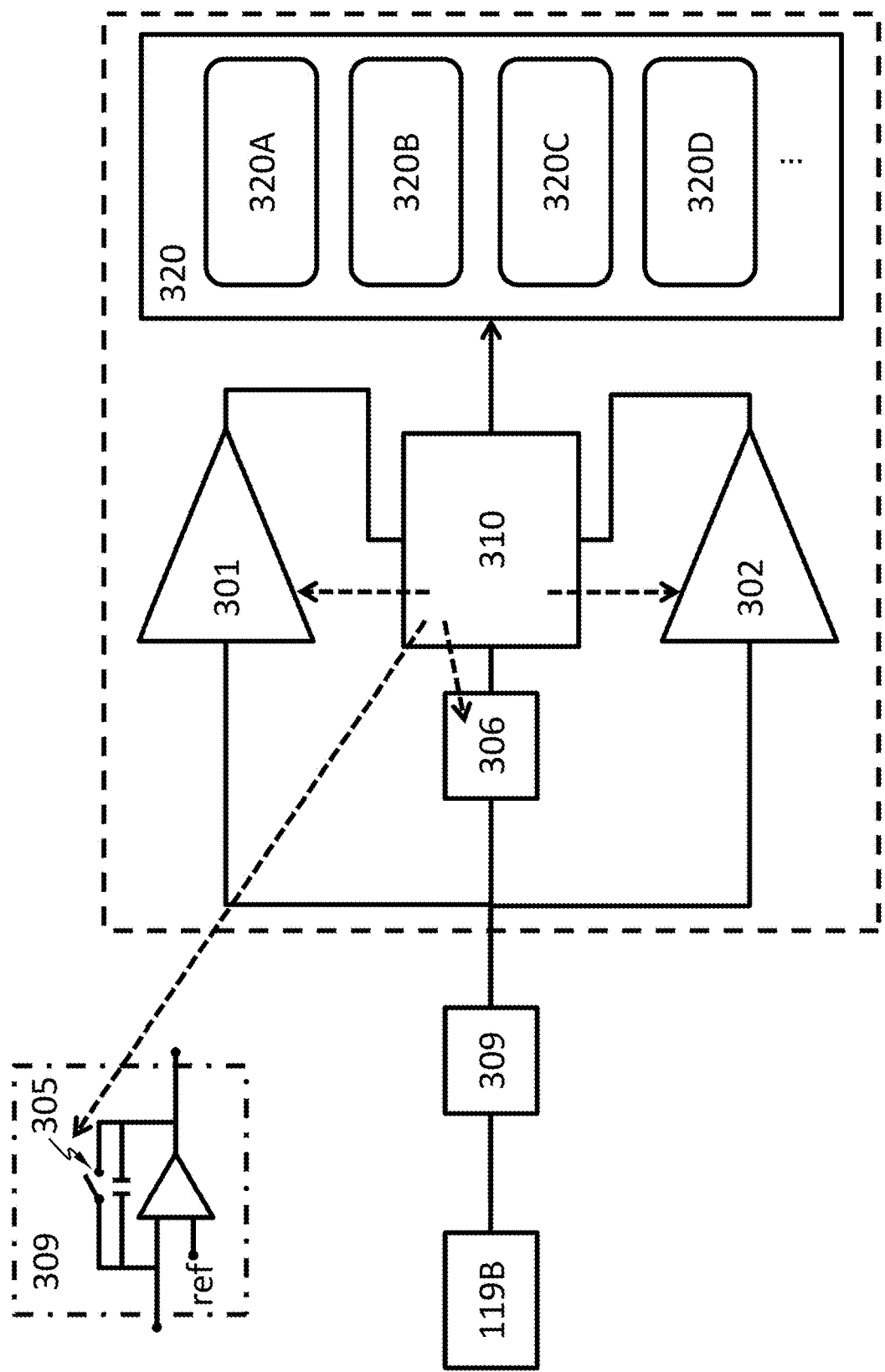
FIG. 6A and FIG. 6B each show a component diagram of the electronic system, according to an embodiment.
Figure 6B:
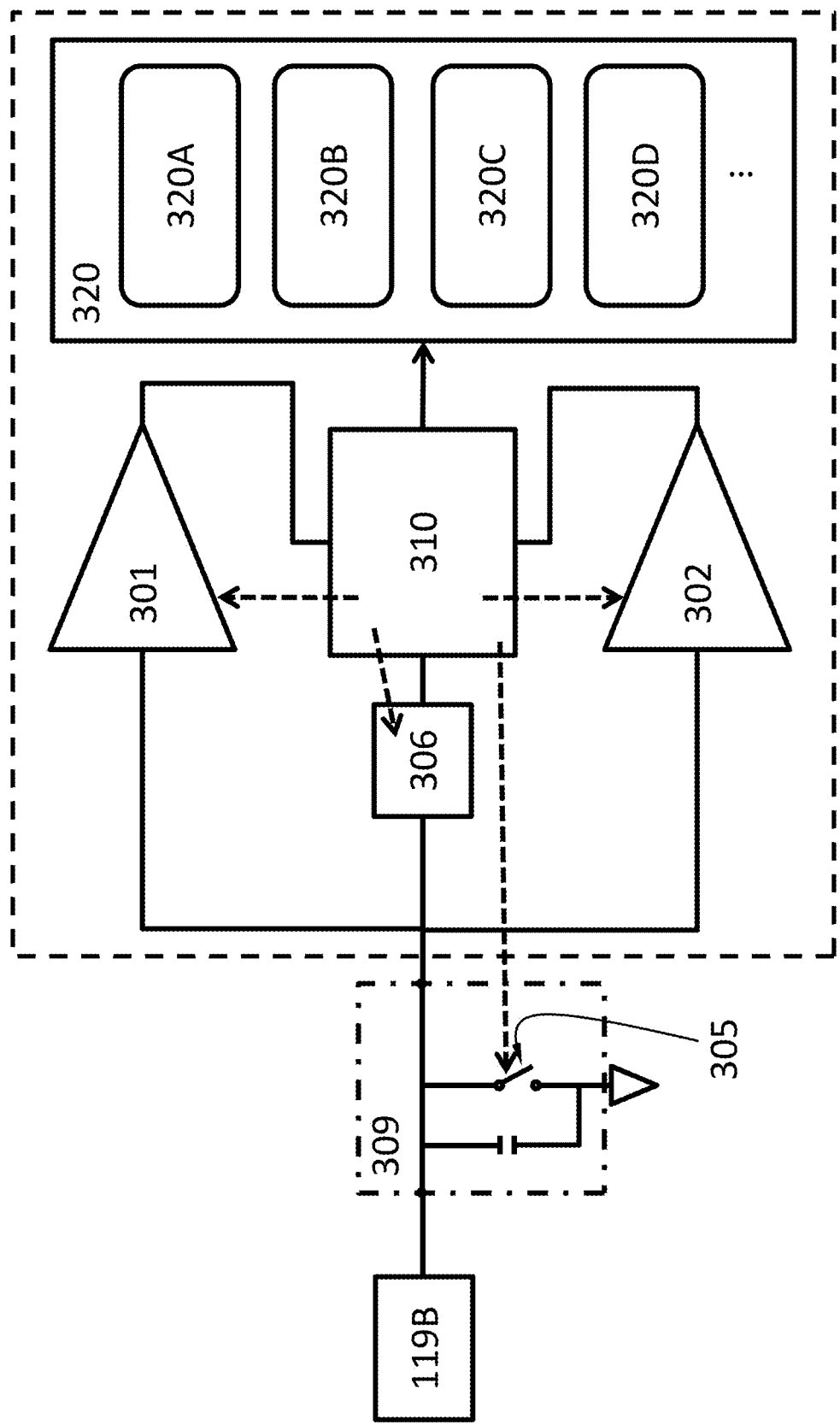

FIG. 6A and FIG. 6B each show a component diagram of the electronic system 121, according to an embodiment. The electronic system 121 may include a first voltage comparator 301, a second voltage comparator 302, a plurality of counters 320 (including counters 320A, 320B, 320C, 320D . . . ), a switch 305, an ADC 306 and a controller 310.

The first voltage comparator 301 is configured to compare the voltage of a discrete portion of the electric contact 119B to a first threshold. The first voltage comparator 301 may be configured to monitor the voltage directly, or calculate the voltage by integrating an electric current flowing through the diode or electrical contact over a period of time. The first voltage comparator 301 may be controllably activated or deactivated by the controller 310. The first voltage comparator 301 may be a continuous comparator. Namely, the first voltage comparator 301 may be configured to be activated continuously, and monitor the voltage continuously. The first voltage comparator 301 configured as a continuous comparator reduces the chance that the system 121 misses signals generated by an incident X-ray photon. The first voltage comparator 301 configured as a continuous comparator is especially suitable when the incident X-ray intensity is relatively high. The first voltage comparator 301 may be a clocked comparator, which has the benefit of lower power consumption. The first voltage comparator 301 configured as a clocked comparator may cause the system 121 to miss signals generated by some incident X-ray photons. When the incident X-ray intensity is low, the chance of missing an incident X-ray photon is low because the time interval between two successive photons is relatively long. Therefore, the first voltage comparator 301 configured as a clocked comparator is especially suitable when the incident X-ray intensity is relatively low. The first threshold may be 1-5%, 5-10%, 10%-20%, 20-30%, 30-40% or 40-50% of the maximum voltage one incident X-ray photon may generate on the electric contact 119B. The maximum voltage may depend on the energy of the incident X-ray photon (i.e., the wavelength of the incident X-ray), the material of the X-ray absorption layer 110, and other factors. For example, the first threshold may be 50 mV, 100 mV, 150 mV, or 200 mV.

The second voltage comparator 302 is configured to compare the voltage to a second threshold. The second voltage comparator 302 may be configured to monitor the voltage directly, or calculate the voltage by integrating an electric current flowing through the diode or the electrical contact over a period of time. The second voltage comparator 302 may be a continuous comparator. The second voltage comparator 302 may be controllably activated or deactivated by the controller 310. When the second voltage comparator 302 is deactivated, the power consumption of the second voltage comparator 302 may be less than 1%, less than 5%, less than 10% or less than 20% of the power consumption when the second voltage comparator 302 is activated. The absolute value of the second threshold is greater than the absolute value of the first threshold. As used herein, the term "absolute value" or "modulus" |x| of a real number x is the non-negative value of x without regard to its sign. Namely, $$|x| = \begin{cases} x, \text{ if } x \geq 0 \\ -x, \text{ if } x \leq 0 \end{cases}.$$

The second threshold may be 200%-300% of the first threshold. For example, the second threshold may be 100 mV, 150 mV, 200 mV, 250 mV or 300 mV. The second voltage comparator 302 and the first voltage comparator 310 may be the same component. Namely, the system 121 may have one voltage comparator that can compare a voltage with two different thresholds at different times.

The first voltage comparator 301 or the second voltage comparator 302 may include one or more op-amps or any other suitable circuitry. The first voltage comparator 301 or the second voltage comparator 302 may have a high speed to allow the system 121 to operate under a high flux of incident X-ray. However, having a high speed is often at the cost of power consumption.

The counters 320 may be a software component (e.g., numbers stored in a computer memory) or a hardware component (e.g., 4017 IC and 7490 IC). Each counter 320 is associated with a bin for an energy range. For example, counter 320A may be associated with a bin for 70-71 KeV, counter 320B may be associated with a bin for 71-72 KeV, counter 320C may be associated with a bin for 72-73 KeV, counter 320D may be associated with a bin for 73-74 KeV. When the energy of an incident X-ray photons is determined by the ADC 306 to be in the bin a counter 320 is associated with, the number registered in the counter 320 is increased by one.

The controller 310 may be a hardware component such as a microcontroller and a microprocessor. The controller 310 is configured to start a time delay from a time at which the first voltage comparator 301 determines that the absolute value of the voltage equals or exceeds the absolute value of the first threshold (e.g., the absolute value of the voltage increases from below the absolute value of the first threshold to a value equal to or above the absolute value of the first threshold). The absolute value is used here because the voltage may be negative or positive, depending on whether the voltage of the cathode or the anode of the diode or which electrical contact is used. The controller 310 may be configured to keep deactivated the second voltage comparator 302, the counter 320 and any other circuits the operation of the first voltage comparator 301 does not require, before the time at which the first voltage comparator 301 determines that the absolute value of the voltage equals or exceeds the absolute value of the first threshold. The time delay may expire after the voltage becomes stable, i.e., the rate of change of the voltage is substantially zero. The phase "the rate of change is substantially zero" means that temporal change is less than 0.1%/ns. The phase "the rate of change is substantially non-zero" means that temporal change of the voltage is at least 0.1%/ns.

The controller 310 may be configured to activate the second voltage comparator during (including the beginning and the expiration) the time delay. In an embodiment, the controller 310 is configured to activate the second voltage comparator at the beginning of the time delay. The term "activate" means causing the component to enter an operational state (e.g., by sending a signal such as a voltage pulse or a logic level, by providing power, etc.). The term "deactivate" means causing the component to enter a non-operational state (e.g., by sending a signal such as a voltage pulse or a logic level, by cut off power, etc.). The operational state may have higher power consumption (e.g., 10 times higher, 100 times higher, 1000 times higher) than the non-operational state. The controller 310 itself may be deactivated until the output of the first voltage comparator 301 activates the controller 310 when the absolute value of the voltage equals or exceeds the absolute value of the first threshold.

The controller 310 may be configured to cause the number registered by one of the counters 320 to increase by one, if, during the time delay, the second voltage comparator 302 determines that the absolute value of the voltage equals or exceeds the absolute value of the second threshold, and the energy of the X-ray photon falls in the bin associated with the counter 320.

The controller 310 may be configured to cause the ADC 306 to digitize the voltage upon expiration of the time delay and determine based on the voltage which bin the energy of the X-ray photon falls in.

The controller 310 may be configured to connect the electric contact 119B to an electrical ground, so as to reset the voltage and discharge any charge carriers accumulated on the electric contact 119B. In an embodiment, the electric contact 119B is connected to an electrical ground after the expiration of the time delay. In an embodiment, the electric contact 119B is connected to an electrical ground for a finite reset time period. The controller 310 may connect the electric contact 119B to the electrical ground by controlling the switch 305. The switch may be a transistor such as a field-effect transistor (FET).

In an embodiment, the system 121 has no analog filter network (e.g., a RC network). In an embodiment, the system 121 has no analog circuitry.

The ADC 306 may feed the voltage it measures to the controller 310 as an analog or digital signal. The ADC may be a successive-approximation-register (SAR) ADC (also called successive approximation ADC). An SAR ADC digitizes an analog signal via a binary search through all possible quantization levels before finally converging upon a digital output for the analog signal. An SAR ADC may have four main subcircuits: a sample and hold circuit to acquire the input voltage ($V_{in}$), an internal digital-analog converter (DAC) configured to supply an analog voltage comparator with an analog voltage equal to the digital code output of the successive approximation register (SAR), the analog voltage comparator that compares $V_{in}$ to the output of the internal DAC and outputs the result of the comparison to the SAR, the SAR configured to supply an approximate digital code of $V_{in}$ to the internal DAC. The SAR may be initialized so that the most significant bit (MSB) is equal to a digital 1. This code is fed into the internal DAC, which then supplies the analog equivalent of this digital code ($V_{ref}/2$) into the comparator for comparison with $V_{in}$. If this analog voltage exceeds $V_{in}$ the comparator causes the SAR to reset this bit; otherwise, the bit is left a 1. Then the next bit of the SAR is set to 1 and the same test is done, continuing this binary search until every bit in the SAR has been tested. The resulting code is the digital approximation of $V_{in}$ and is finally output by the SAR at the end of the digitization.

Figure 7:
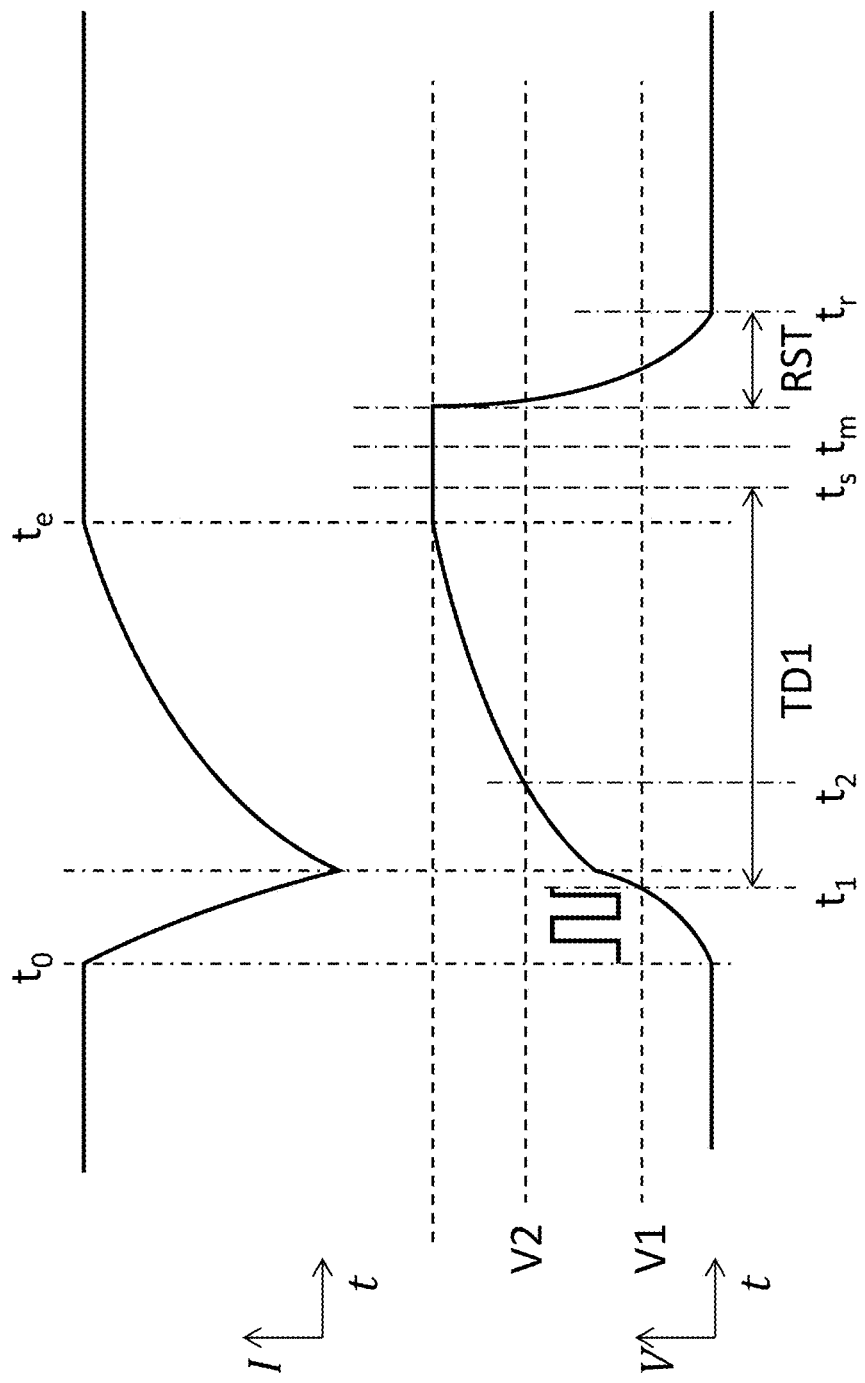
FIG. 7 schematically shows a temporal change of the electric current flowing through the electric contact (upper curve) caused by charge carriers generated by an X-ray photon incident on the pixel associated with the electric contact, and a corresponding temporal change of the voltage of the electric contact (lower curve).

The system 121 may include a capacitor module 309 electrically connected to the electric contact 119B, wherein the capacitor module is configured to collect charge carriers from the electric contact 119B. The capacitor module can include a capacitor in the feedback path of an amplifier. The amplifier configured as such is called a capacitive transimpedance amplifier (CTIA). CTIA has high dynamic range by keeping the amplifier from saturating and improves the signal-to-noise ratio by limiting the bandwidth in the signal path. Charge carriers from the electrode accumulate on the capacitor over a period of time ("integration period") (e.g., as shown in FIG. 7, between is to to). After the integration period has expired, the capacitor voltage is sampled by the ADC 306 and then reset by a reset switch. The capacitor module 309 can include a capacitor directly connected to the electric contact 119B. In an embodiment, the capacitance of the capacitor may be increased to reduce thermal noise when the operating temperature of the detector 100 increases (e.g., the operating temperature increases from −40° C. to 0° C.).

FIG. 7 schematically shows a temporal change of the electric current flowing through the electric contact 119B (upper curve) caused by charge carriers generated by an X-ray photon incident on the pixel 150 associated with the electric contact 119B, and a corresponding temporal change of the voltage of the electric contact 119B (lower curve). The voltage may be an integral of the electric current with respect to time. At time to, the X-ray photon hits the diode or the resistor, charge carriers start being generated in the pixel 150, electric current starts to flow through the electric contact 119B, and the absolute value of the voltage of the electric contact 119B starts to increase. At time $t_1$, the first voltage comparator 301 determines that the absolute value of the voltage equals or exceeds the absolute value of the first threshold V1, and the controller 310 starts the time delay TD1 and the controller 310 may deactivate the first voltage comparator 301 at the beginning of TD1. If the controller 310 is deactivated before $t_1$, the controller 310 is activated at $t_1$. During TD1, the controller 310 activates the second voltage comparator 302. The term "during" a time delay as used here means the beginning and the expiration (i.e., the end) and any time in between. For example, the controller 310 may activate the second voltage comparator 302 at the expiration of TD1. If during TD1, the second voltage comparator 302 determines that the absolute value of the voltage equals or exceeds the absolute value of the second threshold at time $t_2$, the controller 310 waits for stabilization of the voltage to stabilize. The voltage stabilizes at time $t_e$, when all charge carriers generated by the X-ray photon drift out of the X-ray absorption layer 110. At time $t_s$, the time delay TD1 expires. At or after time $t_e$, the controller 310 causes the ADC 306 to digitize the voltage and determines which bin the energy of the X-ray photons falls in. The controller 310 then causes the number registered by the counter 320 corresponding to the bin to increase by one. In the example of FIG. 7, time $t_s$ is after time $t_e$; namely TD1 expires after all charge carriers generated by the X-ray photon drift out of the X-ray absorption layer 110. If time $t_e$ cannot be easily measured, TD1 can be empirically chosen to allow sufficient time to collect essentially all charge carriers generated by an X-ray photon but not too long to risk have another incident X-ray photon. Namely, TD1 can be empirically chosen so that time $t_s$ is empirically after time $t_e$. Time $t_s$ is not necessarily after time $t_e$ because the controller 310 may disregard TD1 once V2 is reached and wait for time $t_e$. The rate of change of the difference between the voltage and the contribution to the voltage by the dark current is thus substantially zero at $t_e$. The controller 310 may be configured to deactivate the second voltage comparator 302 at expiration of TD1 or at $t_2$, or any time in between.

The voltage at time $t_e$ is proportional to the amount of charge carriers generated by the X-ray photon, which relates to the energy of the X-ray photon. The controller 310 may be configured to determine the bin the energy of the X-ray photon falls in, based on the output of the ADC 306.

After TD1 expires or digitization by the ADC 306, whichever later, the controller 310 connects the electric contact 119B to an electric ground for a reset period RST to allow charge carriers accumulated on the electric contact 119B to flow to the ground and reset the voltage. After RST, the system 121 is ready to detect another incident X-ray photon. Implicitly, the rate of incident X-ray photons the system 121 can handle in the example of FIG. 7 is limited by 1/(TD1+RST). If the first voltage comparator 301 has been deactivated, the controller 310 can activate it at any time before RST expires. If the controller 310 has been deactivated, it may be activated before RST expires.

Because the detector 100 has many pixels 150 that may operate in parallel, the detector can handle much higher rate of incident X-ray photons. This is because the rate of incidence on a particular pixel 150 is 1/N of the rate of incidence on the entire array of pixels, where N is the number of pixels.

While various aspects and embodiments have been disclosed herein, other aspects and embodiments will be apparent to those skilled in the art. The various aspects and embodiments disclosed herein are for purposes of illustration and are not intended to be limiting, with the true scope and spirit being indicated by the following claims.

What is claimed is:

1. A system, comprising:
a detector comprising an X-ray absorption layer, an electronics layer;
a cooling system configured to control temperature of the detector and prevent condensation of water vapor on the detector;
wherein the X-ray absorption layer comprises a plurality of pixels, each pixel configured to count numbers of X-ray photons incident thereon whose energy falls in a plurality of bins, within a period of time;
wherein the electronics layer comprises an electronic system configured to add the numbers of X-ray photons for the bins of the same energy range counted by all the pixels;
wherein the cooling system comprises a chiller configured to lower temperature and moisture level of air, and a fan configured to blow the air that is cooled and dried to the detector;
wherein the cooling system further comprises a desiccant dehumidifier configured to extract moisture from the air before blowing the air to the detector.

2. The system of claim 1, wherein the chiller comprises a Peltier cooler.

3. The system of claim 1, wherein the chiller comprises a compressor, a condenser, an evaporator and an expansion valve.

4. The system of claim 1, wherein the system further comprises a transmission window covering an X-ray receiving surface of the X-ray absorption layer, wherein the transmission window is configured to allow X-ray photons to pass through and reach the X-ray absorption layer.

5. The system of claim 4, wherein the transmission window comprises polyimide, graphene, polycarbonate, poly(p-xylylene), silicon nitride, aluminum, beryllium, or a combination thereof.

6. The system of claim 1, wherein the detector is not vacuum-encapsulated in a gas tight housing.

7. The system of claim 1, wherein the system further comprises a cold plate configured to cool the detector by absorbing heat from the detector, wherein the detector is mounted on the cold plate.

8. The system of claim 7, wherein the cold plate is a heat sink, wherein the heat sink is configured to transfer heat absorbed from the detector to the air from the cooling system flowing through and around the heat sink.

9. The system of claim 7, wherein the cold plate is a cooling plate of a Peltier cooler.

10. The system of claim 7, wherein the cold plate is a metal plate cooled by a Peltier cooler or an air conditioner.

11. The system of claim 1, wherein the detector is configured to compile the added numbers as a spectrum of the X-ray photons incident on the detector.

12. The system of claim 1, wherein the plurality of pixels are arranged in an array.

13. The system of claim 1, wherein the pixels are configured to count the numbers of X-ray photons within a same period of time.

14. The system of claim 1, wherein each of the pixels comprises an analog-to-digital converter (ADC) configured to digitize an analog signal representing the energy of an incident X-ray photon into a digital signal.

15. The system of claim 1, wherein the pixels are configured to operate in parallel.

16. The system of claim 1, wherein each of the pixels is configured to measure its dark current.

17. The system of claim 16, wherein each of the pixels is configured to measure its dark current before or concurrently with each X-ray photon incident thereon.

18. The system of claim 16, wherein each of the pixels is configured to deduct a contribution of the dark current from the energy of an X-ray photon incident thereon.

19. The system of claim 16, wherein each of the pixels is configured to measure its dark current by measuring a time it takes for a voltage to increase by a threshold.

20. The system of claim 14, wherein the ADC is a successive-approximation-register (SAR) ADC.

21. The system of claim 1, wherein the electronic system comprises a first voltage comparator configured to compare a voltage of an electric contact of the X-ray absorption layer to a first threshold, a second voltage comparator configured to compare the voltage to a second threshold, a controller, a plurality of counters each associated with a bin and configured to register a number of X-ray photons absorbed by one of the pixels wherein the energy of the X-ray photons falls in the bin;
wherein the controller is configured to start a time delay from a time at which the first voltage comparator determines that an absolute value of the voltage equals or exceeds an absolute value of the first threshold;
wherein the controller is configured to determine whether an energy of an X-ray photon falls into the bin; wherein the controller is configured to cause the number registered by the counter associated with the bin to increase by one.

22. The system of claim 21, wherein the electronic system further comprises a capacitor module electrically connected to the electric contact, wherein the capacitor module is configured to collect charge carriers from the electric contact.

23. The system of claim 21, wherein the controller is configured to activate the second voltage comparator at a beginning or expiration of the time delay.

24. The system of claim 21, wherein the controller is configured to connect the electric contact to an electrical ground.

25. The system of claim 21, wherein a rate of change of the voltage is substantially zero at expiration of the time delay.

26. The system of claim 1, wherein the X-ray absorption layer comprises a diode.

27. The system of claim 1, wherein the X-ray absorption layer comprises silicon, germanium, GaAs, CdTe, CdZnTe, or a combination thereof.

28. The system of claim 1, wherein the detector does not comprise a scintillator.

* * * * *